United States Patent [19]

Dennis

[11] Patent Number: 4,575,677
[45] Date of Patent: Mar. 11, 1986

[54] MOTOR SPEED DETECTOR
[75] Inventor: Charles L. Dennis, Richardson, Tex.
[73] Assignee: Mobil Oil Corporation, New York, N.Y.
[21] Appl. No.: 614,082
[22] Filed: May 25, 1984
[51] Int. Cl.$^4$ ............................................. G01P 3/56
[52] U.S. Cl. ...................................... 324/161; 324/166; 361/240
[58] Field of Search ............... 324/161, 166, 173, 174; 361/242, 240; 364/565, 574; 73/507, 510, 537

[56] References Cited
U.S. PATENT DOCUMENTS 3,560,854  2/1971  Moss et al. .................... 324/161 X
3,611,343 10/1971  Schoenbach .................... 324/161 X
4,237,517 12/1980  Myers ............................ 361/240 X
4,506,312  3/1985  Chan et al. ..................... 361/242 X Primary Examiner—Stanley T. Krawczewicz
Attorney, Agent, or Firm—A. J. McKillop; Michael G. Gilman; George W. Hager, Jr.

[57] ABSTRACT

A motor speed detector employs a magnetic sensor for detecting rotational movement of rotor armature segments of the motor and for producing real tachometer pulses in response to such movement. False tachometer pulses produced by extraneous non-rotor motor components are discriminated against to produce a signal representative of actual motor rotational speed.

6 Claims, 3 Drawing Figures

MOTOR SPEED DETECTOR

BACKGROUND OF THE INVENTION

This invention relates to a method and system for detecting rotational motion of motors.

It has become conventional practice, as shown in FIG 1, to utilize a magnetic sensor to detect rotational motion of a motor and produce tachometer pulses representative of such motion. Conventional amplitude discriminators have been employed to distinguish between actual tachometer pulses related directly to rotational movement of the motor and any extraneous tachometer pulses that may be produced during motor operation.

SUMMARY OF THE INVENTION

In accordance with the present invention there is provided a method and system for detecting rotational speed of a motor A first signal is produced comprising real tachometer pulses responsive to revolution of rotor armature segments of the motor and false tachometer pulses responsive to extraneous, non-rotor components of the motor, both the real and false tachometer pulses increasing in amplitude with increasing rotational speed of the motor. A second signal is produced with amplitude equal to the maximum amplitude of the real tachometer pulses. A third signal is produced with amplitude less than that of such second signal and exceeding the maximum expected amplitude of the false tachometer pulses. The first and third signals are compared so as to discriminate against false tachometer pulses and to produce an output directly proportional to the rotational speed of the motor as represented solely by the real tachometer pulses. In a further aspect, this comparison is made only when such third signal exceeds the amplitude of the real tachometer pulses at a minimum rotational speed of the motor at which none of the false tachometer pulses are produced.

In a more specific aspect, both the real and false tachometer pulses from the magnetic sensor are applied to a capacitor which charges to the level of the largest amplitude tachometer pulses. A resistive divider across the capacitor provides a trip level signal that is a select percentage of the voltage across the capacitor, such percentage being selected such that the trip level signal always exceeds the largest amplitude false tachometer pulse expected for the particular rotational speed of the motor. A reference signal is established representing the amplitudes of the real tachometer pulses for the minimum rotational speed of the motor at which none of the false tachometer pulses are produced. The trip level signal is applied to one input of a comparator when it exceeds the reference signal. Both the real and false tachometer pulses are applied to the other input of the comparator. The comparator produces output pulses in response to real tachometer pulses that exceed the trip level signal and discriminate against false tachometer pulses that do not exceed the trip level signal, such output pulses being thereby directly proportional to the rotational speed of the motor.

DESCRIPTION OF THE PREFERRED EMBODIMENT

The motor speed detector of the present invention will best be described and understood when taken in conjunction with a typical use for such detector.

Figure 1:
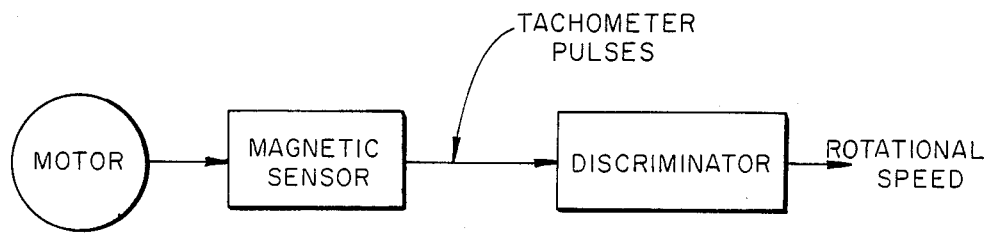
FIG. 1 illustrates a motor rotational speed detector of the prior art.
Figure 2:
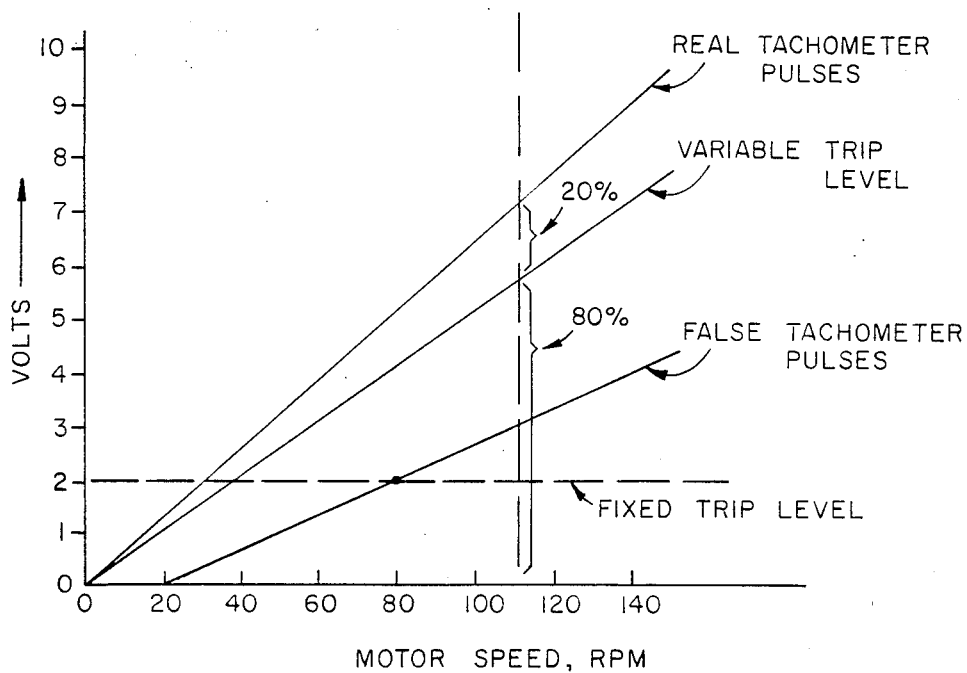
FIG. 2 is a graph illustrating rotational speed of a conventional motor as represented by tachometer pulses.

In conventional well drilling operations, top drive prime movers have recently became available which for applying torque directly to a drill string and drill bit for the drilling of a borehole in an earth formation. One such system is the Top Drive Drilling System manufactured and supplied by Varco Drilling Systems, 800 N. Eckhoff St., Orange, Calif. 92668. The drilling motor is a standard oilfield DC motor of the type most commonly found on conventional electric rotary drives, namely, the 1000 horsepower General Electric Model 752 drilling motor. This Varco top drive prime mover includes a magnetic sensor as an integral part of the General Electric drilling motor. This sensor looks at rotor armature segments of the drilling motor as they rotate past the sensor and produces tachometer pulses as an indication of rpm of the drilling motor. Each revolution of the armature of the drilling motor causes 101 tachometer pulses to be produced by the magnetic sensor. At low rotational speeds of less than 20 rpm, these tachometer pulses are a real representation of such speed. However, at rotational speeds exceeding 20 rpm various extraneous parts of the drilling motor, i.e. balance holes, bolt heads, etc., have been found to cause the magnetic sensor to produce false tachometer pulses. These false tachometer pulses grow in amplitude as the rotational speed of the drilling motor increases. The amplitudes of these false pulses become large enough that conventional amplitude discrimination circuits will not distinguish between these false pulses and the real tachometer pulses directly related to the rotor armature segments. Consequently, too great a rotational speed will be indicated. This may be more fully understood by referring to FIG. 2. At 20 rpm motor speed, the real tachometer pulses are about 1.5 volts and there are no false tachometer pulses. Above 20 rpm the real tachometer pulses increase to about 9 volts at 140 rpm while the false tachometer pulses increase to about 4 volts. Conventional amplitude discriminators would set a fixed trip level to pass the higher amplitude real pulses and eliminate the lower amplitude false pulses. Such a fixed trip level might be set at 2 volts, for example, as shown in FIG. 2. This would eliminate all those false pulses up to 80 rpm, but it would also eliminate all those real pulses between 0 and about 30 rpm which are less than 2 volts. It is, therefore, a specific aspect of the present invention to eliminate this inherent limitation in the fixed trip level method of the prior art pulse amplitude discrimination by providing for a trip level which increases in proportion to the increase in the amplitude of the real tachometer pulses. In this way, the trip level always exceeds the amplitudes of the false tachometer pulses but is below the amplitudes of the real tachometer pulses regardless of drilling motor speed. In the illustration of FIG. 2, the trip level is shown as always falling between the real tachometer pulses amplitude curve and the false tachometer pulses amplitude curve. A particularly suitable trip level for any give motor speed has been found to be about 80% of the real tachometer pulse amplitude.

Figure 3:
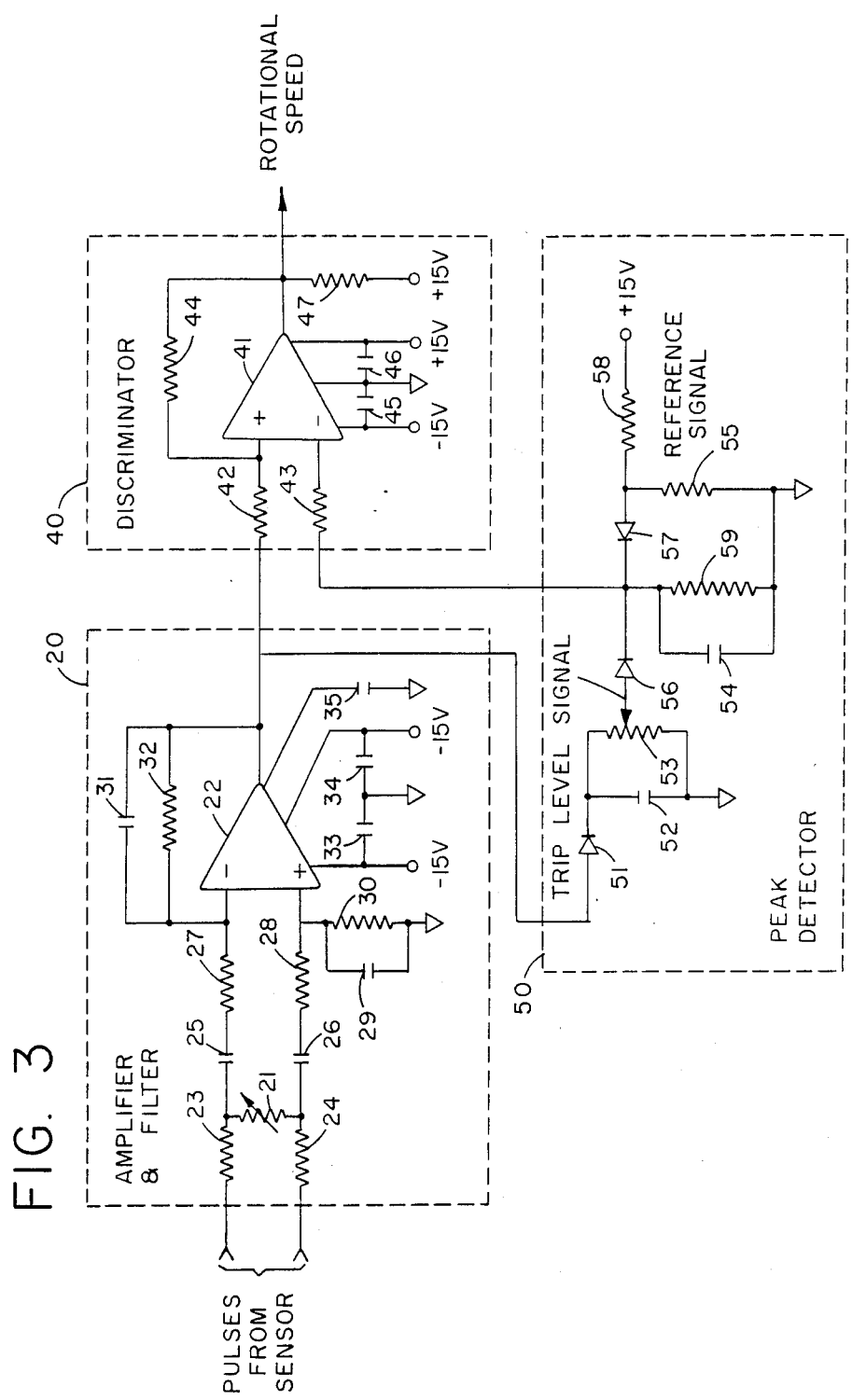
FIG. 3 is an electrical schematic of the rotational motion detector of the present invention.

To carry out this aspect of the invention there is provided the rotational motion detector of FIG. 3. Tachometer pulses from the magnetic sensor in the drilling motor are applied as input to the amplifier and filter 20. A variable resistor 21 across the input terminals allows balanced gain adjustment of zero to 0.2. A differential amplifier 22 of unity gain removes 60 hertz components and restricts band width to frequencies less than 10.7 kilohertz. The amplified and filtered tachometer pulses from the differential amplifier 22 are applied to both a discriminator 40 and a peak detector 50.

Referring first to the peak detector 50, the desired trip level signal is selected by the combination of input diode 51, capacitor 52 charges to the level of the largest amplitude tachometer pulses from differential amplifier 22 and resistor 53 is a variable resistance which is set to pass a desired percentage of the voltage stored on capacitor 52 onto the discriminator 40. A suitable setting might select about 80% of the voltage on capacitor 52 as the trip level signal. A capacitor 54 and parallel resistor 59 provides noise bypass and a resistor 55 sustains a leakage path for diodes 56 and 57. To prevent extraneous motor components from triggering at less than 20 rpm, a reference signal is provided by the divider network of resistor 55 and 58 which produces a particularly suitable reference signal of about 1.5 volts. A trip level signal which exceeds this reference signal is applied by diodes 56 and 57 to the inverting input of comparator 41 of the discriminator 40.

Applied to the noninverting input of comparator 41 of discriminator 40 is the amplified and filtered tachometer pulses from the differential amplifier 22 exceed the trip level signal established by the peak detector 50.

For the example drawn in FIG. 2, at 20 rpm, real tachometer pulses are 1.5 volts and false tachometer pulses are zero. This equals the reference signal of 1.5 volts and discriminator 40 produces an output corresponding to the real tachometer pulses. At 80 rpm the real tachometer pulses are 5 volts, the false tachometer pulses are 2 volts and the trip level signal is 4.0 volts (i.e. 80%×5 volts). Discriminator 40 again produces an output corresponding to the real tachometer pulses, but not corresponding to the false tachometer pulses as they are less than the trip level signal. At 140 rpm the real tachometer pulses are 9 volts, the false tachometer pulses are 4 volts, and the trip level signal is 7.2 volts (i.e. 80%×9 volts). Discriminator 40 again produces an output corresponding to the real tachometer pulses, but not corresponding to the false tachometer pulses.

It is to be understood that the circuitry illustrated in detail in FIG. 3 is merely representative of one embodiment of the rotational motion detector of the present invention. In accordance with such embodiment, the following sets forth specific types and values of circuit components:

| Reference Designation | Description |
| --- | --- |
| Amplifier 22 | HA 2510 |
| Comparator 41 | μA 734 |
| Diodes 51, 56 & 57 | IN 914 |
| Resistors 23, 24, 27, 28, 30, 32, & 58 | 10K |
| Resistor 42 & 43 | 4.99K |
| Resistor 47 | 4.7K |
| Resistor 54 | 200K |
| Resistor 53 | 100K |

-continued

| Reference Designation | Description |
| --- | --- |
| Resistor 55 | 1K |
| Resistor 59 | 1 M |
| Capacitors 25 & 26 | 22 μf |
| Capacitors 29 & 31 | 0.0015 f |
| Capacitor 35 | 10 pf |
| Capacitor 52 | 10 μf |
| Capacitor 54 | 0.1 f |

Various modifications to the disclosed embodiment of the rotational motion detector itself, including variations in the types and values of circuit components, may become apparent to one skilled in the art without departing from the scope and spirit of the invention as hereinafter defined by the appended claims.

I claim:

1. A method for detecting rotational speed of a motor, comprising the step of:
    (a) producing a first signal comprising real tachometer pulses responsive to revolution of rotor armature segments of said motor and false tachometer pulses responsive to extraneous non-rotor components of said motor, both said real and false tachometer pulses increasing in amplitude with increasing rotational speed of said motor,
    (b) producing a second signal with amplitude representative of the maximum amplitude of said real tachometer pulses,
    (c) producing a third signal with amplitude less than that of said second signal and exceeding the maximum expected amplitude of said false tachometer pulses, and
    (d) comparing said first and third signals to discriminate against said false tachometer pulses and produce a fourth signal that is directly proportional to the rotational speed of said motor as represented solely by said real tachometer pulses.

2. The method of claim 1 further including the steps of:
    (a) producing a fifth signal representative of the amplitude of said real tachometer pulses at a selected minimum rotation speed of said motor at which none of said false tachometer pulses are produced, and
    (b) comparing said first and third signals only when said third signal exceeds said fifth signal.

3. A system for detecting rotational speed of a motor, comprising:
    (a) a magnetic sensor, responsive to the rotational motion of said motor for producing a plurality of real tachometer pulses in response to the revolution of rotor armature segments of said motor past said magnetic sensor as well as a plurality of false tachometer pulses in response to the movement of extraneous non-rotor components of the motor past said magnetic sensor, both said real and false tachometer pulses increasing in amplitude as the rotational speed of said motor increases,
    (b) a capacitor to which said real and false tachometer pulses are applied, said capacitor charging to the level of the largest amplitude tachometer pulses,
    (c) a resistive divider across said capacitor, said resistive divider providing a trip level signal that is a select percentage of the voltage across said capacitor, said percentage being selected such that the trip level signal always exceeds the largest amplitude false tachometer pulse expected for the particular rotational speed of said motor, (d) means for establishing a reference signal that is representative of the amplitudes of said real tachometer pulses for the minimum rotational speed of said motor at which none of said false tachometer pulses are produced, (e) a comparator, (f) means for applying said trip level signal to a first input of said comparator when it exceeds said reference signal, and (g) means for applying said real and false tachometer pulses to a second input of said comparator, said comparator producing output pulses in response to real tachometer pulses that exceed said trip level signal and discriminating against false tachometer pulses that do not exceed said trip level signal, said output pulses being thereby directly proportional to the rotational speed of said motor.

4. The system of claim 3 wherein said trip level signal is selected to represent about 80 percent of the voltage across said capacitor.

5. The system of claim 3 wherein said minimum rotational speed of said motor at which none of said false tachometer pulses are produced in at least 20 revolutions per second.

6. The system of claim 5 wherein said reference signal is at least 1.5 volts.

* * * * *